(12) United States Patent
Ide et al.

(10) Patent No.: US 9,142,936 B2
(45) Date of Patent: Sep. 22, 2015

(54) LASER LIGHT SOURCE DEVICE AND METHOD FOR MANUFACTURING LASER LIGHT SOURCE DEVICE

(71) Applicant: CITIZEN HOLDINGS CO., LTD., Tokyo (JP)

(72) Inventors: Masafumi Ide, Saitama (JP); Takeo Komiyama, Tokyo (JP); Kaoru Yoda, Nagano (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/386,818

(22) PCT Filed: Mar. 14, 2013

(86) PCT No.: PCT/JP2013/057264
§ 371 (c)(1),
(2) Date: Sep. 22, 2014

(87) PCT Pub. No.: WO2013/146313
PCT Pub. Date: Oct. 3, 2013

(65) Prior Publication Data
US 2015/0048147 A1    Feb. 19, 2015

(30) Foreign Application Priority Data

Mar. 26, 2012 (JP) ................. 2012-069467

(51) Int. Cl.
*B23K 31/00* (2006.01)
*H01S 5/022* (2006.01)
(Continued)

(52) U.S. Cl.
CPC ........... *H01S 5/02248* (2013.01); *B23K 1/0016* (2013.01); *B23K 31/02* (2013.01);
(Continued)

(58) Field of Classification Search
CPC ........ B23K 31/02; B23K 1/0016; B23K 1/20; B23K 2201/40; B23K 26/365; B23K 35/3013; G01J 1/32; G02B 19/0019; G02B 19/0028; G02B 19/0057; G02B 27/1006; G02B 27/141; G02B 6/4232; H05K 1/0274; H05K 1/111; H05K 2201/09745; H05K 2203/0369
See application file for complete search history.

(56) References Cited

U.S. PATENT DOCUMENTS

2008/0212191 A1   9/2008   Harle et al.
2011/0122481 A1   5/2011   Ide et al.

FOREIGN PATENT DOCUMENTS

JP    S57-68098 A    4/1982
(Continued)

OTHER PUBLICATIONS

International Search Report for PCT/JP2013/057264, Apr. 16, 2013.

*Primary Examiner* — Erin Saad

(57) ABSTRACT

The present invention is a laser light source device having: a silicon substrate having a first flat surface and a second flat surface which is formed at a position lower than the first flat surface by a level difference in the thickness direction; a first junction having a microbump structure comprising Au formed on the first flat surface; a second junction having a microbump structure comprising Au formed on the second flat surface; a first optical element and a second optical element for emitting laser light, which are joined to the first junction by a surface activation technique; a reflective member for reflecting the laser light from the first optical element toward a multiplexer, the reflective member being joined to the second junction by the abovementioned technique; and a multiplexer for directly receiving the laser light from the second optical element and multiplexing the laser light from the first optical element and the laser light from the second optical element, the multiplexer being joined to the second junction by the abovementioned technique; a configuration being adopted whereby the distance between the first optical element and the reflective member is different from the distance between the second optical element and the multiplexer, and the length of the optical path from the first optical element to the multiplexer is equal to the length of the optical path from the second optical element to the multiplexer.

5 Claims, 9 Drawing Sheets

(51) Int. Cl.
  *G02B 27/10* (2006.01)
  *G01J 1/32* (2006.01)
  *G02B 27/14* (2006.01)
  *G02B 19/00* (2006.01)
  *H01S 5/40* (2006.01)
  *B23K 1/00* (2006.01)
  *B23K 31/02* (2006.01)
  *H05K 3/30* (2006.01)
  *H05K 13/04* (2006.01)

(52) U.S. Cl.
  CPC .............. *G01J 1/32* (2013.01); *G02B 19/0019* (2013.01); *G02B 19/0028* (2013.01); *G02B 27/1006* (2013.01); *G02B 27/141* (2013.01); *H01S 5/02292* (2013.01); *H01S 5/4025* (2013.01); *H01S 5/4093* (2013.01); *H05K 3/303* (2013.01); *H05K 13/0465* (2013.01)

(56) References Cited

FOREIGN PATENT DOCUMENTS

| | | |
|---|---|---|
| JP | H04-111381 A | 4/1992 |
| JP | 2002-203329 A | 7/2002 |
| JP | 2004-241096 A | 8/2004 |
| JP | 2006-108547 A | 4/2006 |
| JP | 2008-219015 A | 9/2008 |
| JP | 2011-109002 A | 6/2011 |
| JP | 2011-175268 A | 9/2011 |
| JP | 2011-257580 A | 12/2011 |

FIG. 7
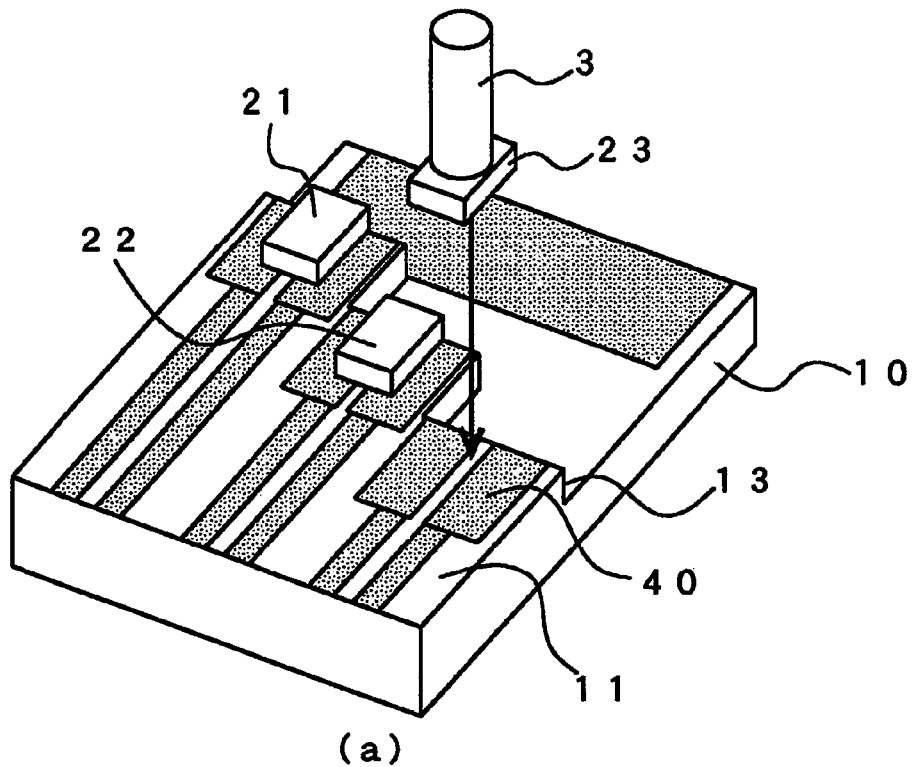
(a)
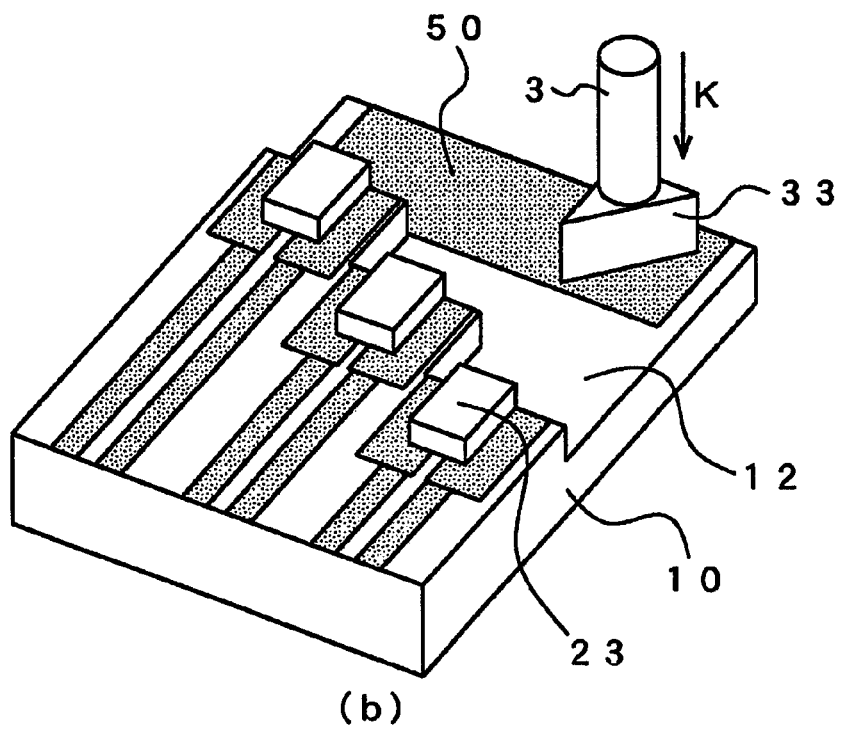
(b)

FIG. 8
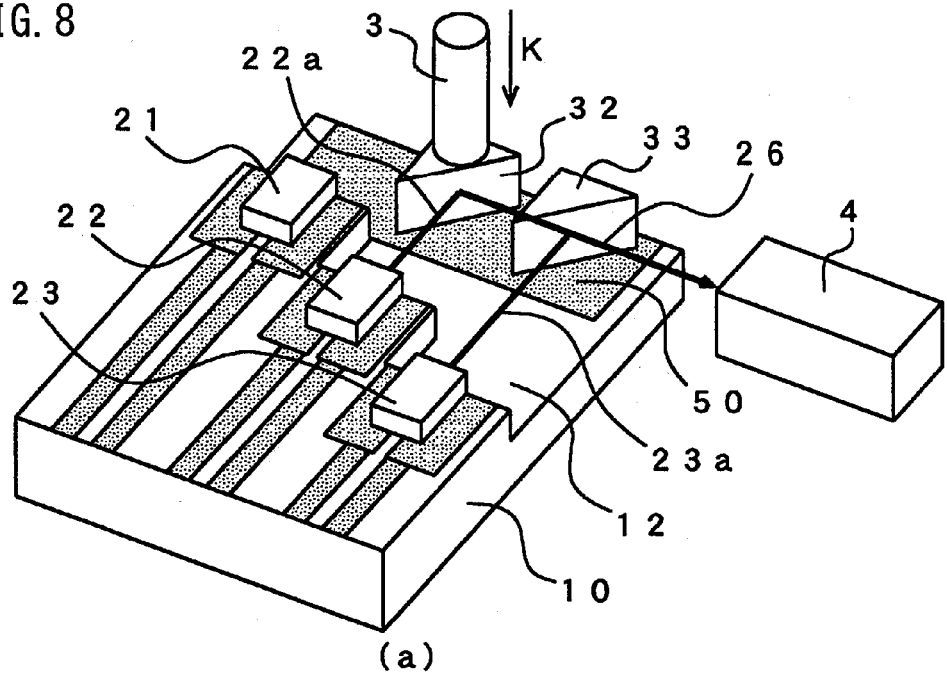
(a)
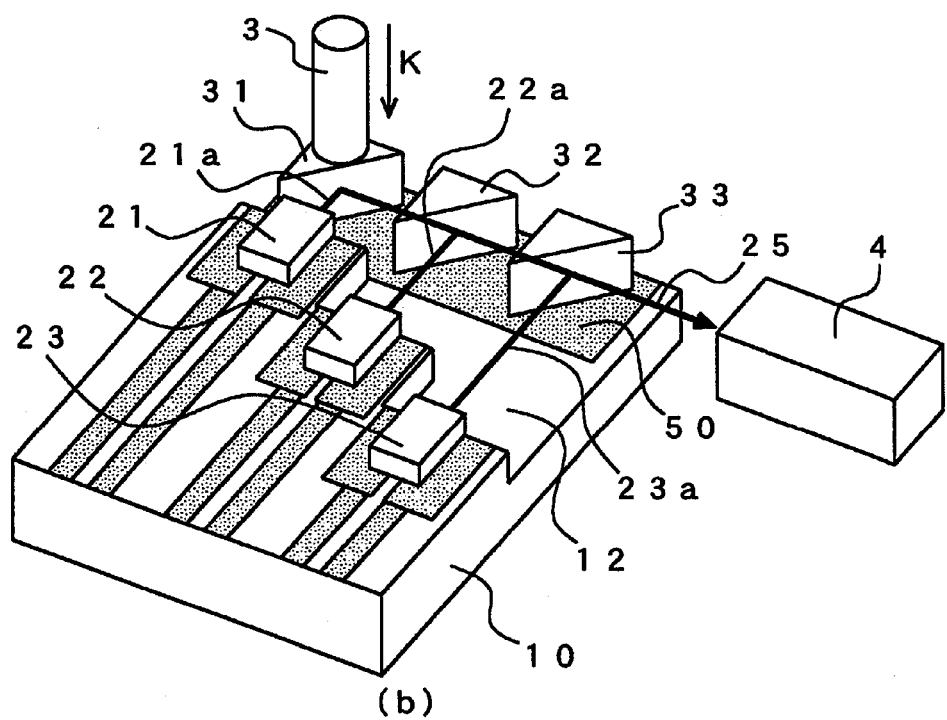
(b)

LASER LIGHT SOURCE DEVICE AND METHOD FOR MANUFACTURING LASER LIGHT SOURCE DEVICE

TECHNICAL FIELD

The present invention relates to a laser light source device and a method for manufacturing the laser light source device, and more particularly to a laser light source device constructed by mounting optical elements and optical combiners on a single substrate, and a method for manufacturing such a laser light source device.

BACKGROUND ART

It is known in the art to provide a projector which modulates light emitted from a light source unit by using a spatial light modulator and which projects the modulated light in an enlarged form onto a screen through a projection optical system such as a projection lens, etc. Traditionally, a metal halide lamp or a halogen lamp has been used as the light source unit for such a projector. However, in recent years, for such purposes as downsizing the light source unit and the projector while at the same time achieving extended service life and enhanced image quality, a display apparatus has been proposed that uses a light source constructed from laser diodes (LDs) of three primary colors (RGB) (for example, refer to patent document 1).

The laser light source used in the projection-type display apparatus disclosed in patent document 1 has a can-type structural stem. More specifically, an LD chip is rigidly fastened onto a common terminal that is connected to the stem by vertically passing therethrough, and the common terminal and a terminal to which the other electrode of the LD chip is connected by a wire are brought out to the back side of the stem; then a cylindrically shaped metal cap having a transparent window is mounted on the stem to seal the LD chip therein. In patent document 1, a laser unit which includes three such can-type laser light sources, one for each of the RGB colors, and which combines the laser light from the respective laser light sources by using a plurality of dichroic mirrors and outputs the combined laser light through a lens, is proposed as the light source for the display apparatus.

PRIOR ART LITERATURE

Patent Literature

Patent document 1: Japanese Unexamined Patent Publication No. 2011-175268

SUMMARY

In recent years, the need for tiny projectors called pico projectors designed for use in portable devices has been increasing. However, the laser unit incorporated in the display apparatus disclosed in patent document 1 is of the type in which each can-type laser light source is fitted into a hole opened in a wiring substrate and is mounted thereto by soldering. It is therefore difficult to achieve size reductions; in fact, it is not possible to achieve a laser unit smaller in thickness than the diameter of the laser light source. There is thus a limit to how much the can-type laser light source disclosed in patent document 1 can be reduced in size and thickness.

Further, in the laser unit disclosed in patent document 1, the laser light sources to be soldered, the plurality of dichroic mirrors, and the lens must be aligned relative to each other in order to adjust the light path for the laser light to be emitted. This has led to the problem that the adjustment process of the laser unit is complex and the light path adjustment is difficult to accomplish. Furthermore, since there are many parts to be adjusted, the light path may vary for each laser light, resulting in the problem that the light loss increases and the coupling efficiency drops.

An object of the present invention is to provide a laser light source device wherein provisions are made to solve the above-outlined problems, and a method for manufacturing such a laser light source device.

Another object of the present invention is to provide a laser light source device that is compact and thin in design and makes light path adjustments easy by integrating optical elements, etc., on a single substrate, and a method for manufacturing such a laser light source device.

There is provided a laser light source device includes a silicon substrate having a first planar surface and a second planar surface, the second planar surface being formed lower than the first planar surface by forming therebetween a step in a thickness direction of the silicon substrate, a first bonding portion having a micro-bump structure made of Au formed on the first planar surface, a second bonding portion having a micro-bump structure made of Au formed on the second planar surface, first and second optical elements for emitting laser light, each optical element being bonded to the first bonding portion by surface activated bonding, a reflecting member, bonded to the second bonding portion by surface activated bonding, for reflecting the laser light received from the first optical element toward the optical combiner, and an optical combiner, bonded to the second bonding portion by surface activated bonding, for directly receiving the laser light from the second optical element and thereby combining the laser light from the second optical element with the laser light from the first optical element, and wherein the distance between the first optical element and the reflecting member is made different from the distance between the second optical element and the optical combiner so that the light path length from the first optical element to the optical combiner becomes equal to the light path length from the second optical element to the optical combiner.

Preferably, in the laser light source device, the step formed in the thickness direction of the silicon substrate is formed in a staircase shape horizontally across the first planar surface, and the first and second optical elements are arranged along staircase-shaped edge faces of the step formed in the thickness direction.

Preferably, in the laser light source device, the first and second optical elements are laser devices, and the optical combiner is a dichroic mirror prism.

Preferably, the laser light source device further includes a driver IC, mounted on the silicon substrate, for driving the first and second optical elements.

Preferably, the laser light source device further includes a third optical element for emitting laser light and a second optical combiner, wherein the second optical combiner directly receives the laser light from the third optical element, and combines the laser light from the third optical element with the laser light from the second optical element combined by the optical combiner with the laser light from the first optical element.

There is also provided a method for manufacturing a laser light source device, includes the steps of forming a first planar surface and a second planar surface on a silicon substrate, the second planar surface being formed lower than the first planar surface by forming therebetween a step in a thickness direction of the silicon substrate, forming a first bonding portion having a micro-bump structure made of Au on the first planar surface; forming a second bonding portion having a micro-bump structure made of Au on the second planar surface, bonding first and second optical elements to the first bonding portion by surface activated bonding, the first and second optical elements being arranged to emit laser light, bonding an optical combiner to the second bonding portion by surface activated bonding, the optical combiner being positioned to directly receive the laser light from the second optical element and to combine the laser light from the second optical element with the laser light from the first optical element, and bonding a reflecting member to the second bonding portion by surface activated bonding, the reflecting member being positioned to reflect the laser light received from the first optical element toward the optical combiner, and wherein the distance between the first optical element and the reflecting member is made different from the distance between the second optical element and the optical combiner so that the light path length from the first optical element to the optical combiner becomes equal to the light path length from the second optical element to the optical combiner.

Preferably, the laser light source device manufacturing method further includes the steps of causing the first and second optical elements to emit the laser light, and adjusting the position of the reflecting member so that the light path of the laser light from the first optical element and the light path of the laser light from the second optical element overlap each other.

Preferably, in the laser light source device manufacturing method, the laser light source device further includes a third optical element for emitting laser light and a second optical combiner for combining the laser light from the third optical element with the laser light from the second optical element combined by the optical combiner with the laser light from the first optical element, wherein in the step of adjusting the position of the reflecting member, the position of the reflecting member is adjusted so that the light path of the laser light from the second optical element combined by the optical combiner with the laser light from the first optical element and the light path of the laser light from the third optical element overlap each other.

Preferably, in the laser light source device manufacturing method, the step formed in the thickness direction of the silicon substrate is formed in a staircase shape horizontally across the first planar surface, and the first and second optical elements are arranged along staircase-shaped edge faces of the step formed in the thickness direction.

Preferably, in the laser light source device manufacturing method, the first and second optical elements are laser devices, and the optical combiner is a dichroic mirror prism.

Preferably, the laser light source device manufacturing method further comprises the step of mounting on the silicon substrate a driver IC for driving the first and second optical elements.

A laser light source device is provided which is constructed by mounting on a silicon substrate a plurality of optical elements and a plurality of optical combiners for combining the laser light emitted from the plurality of optical elements, the laser light source device includes the silicon substrate includes a bonding portion having a micro-bump structure made of Au, the plurality of optical elements and the plurality of optical combiners are bonded to the bonding portion by surface activated bonding, the silicon substrate includes a first planar surface and a second planar surface which is formed lower than the first planar surface by forming therebetween a step in a thickness direction of the silicon substrate, the plurality of optical elements are bonded to the first planar surface, the plurality of optical combiners are bonded to the second planar surface in such a manner as to correspond to respective ones of the plurality of optical elements, the step formed in the thickness direction of the silicon substrate is formed in a staircase shape horizontally across the first planar surface, and the plurality of optical elements are arranged along edge faces of the staircase-shaped step formed in said thickness direction, thereby arranging the respective optical elements at different distances with respect to their corresponding optical combiners so that the light path length becomes substantially equal for all the laser light emitted from the plurality of optical elements.

A manufacturing method is provided for a laser light source device which is constructed by mounting on a silicon substrate a plurality of optical elements and a plurality of optical combiners for combining the laser light emitted from the plurality of optical elements, the manufacturing method includes the steps of a stepped substrate forming step for forming a step in a thickness direction of the silicon substrate and thereby forming on the silicon substrate a first planar surface and a second planar surface which is formed lower than the first planar surface, a bonding portion forming step for forming a bonding portion having a micro-bump structure made of Au on the silicon substrate; an optical element bonding step for bonding a plurality of optical elements to the first planar surface by surface activated bonding; and an optical combiner bonding step for bonding a plurality of optical combiners to the second planar surface by surface activated bonding in such a manner as to correspond to respective ones of the plurality of optical elements, and wherein in the stepped substrate forming step, the step is formed in a staircase shape horizontally across the first planar surface and, in the optical element bonding step, the plurality of optical elements are bonded along edge faces of the staircase-shaped step, thereby arranging the respective optical elements at different distances with respect to their corresponding optical combiners so that the light path length becomes substantially equal for all the laser light emitted from the plurality of optical elements.

In the laser light source device manufacturing method, the optical combiner bonding step includes the sub-steps of bonding a first one of the plurality of optical combiners, causing two of the plurality of optical elements to emit laser light, adjusting the position of a second one of the plurality of optical combiners so that the light path of one laser light and the light path of the other laser light, when combined by the second optical combiner, overlap each other, bonding the second optical combiner, causing all of the plurality of optical elements to emit laser light; adjusting the position of a third one of the plurality of optical combiners so that the light paths of all the laser light, when combined by the third optical combiner, overlap each other; and bonding the third optical combiner.

Since the optical elements, optical combiners, and reflecting member can be bonded to the silicon substrate by surface activated bonding and thus integrated on the substrate, the laser light source device can be made compact and thin in design.

Since the surface activated bonding technique that uses micro bumps and that does not require heating for bonding is used in the manufacture of the laser light source device, no thermal stress is applied and no functional degradation of the components occurs, which serves to prevent the occurrence of distortion due to the difference in thermal expansion coefficient.

In the laser light source device, since the optical elements and optical combiners are each bonded by surface activated bonding, misalignment during component mounting is minimized, and highly accurate alignment can be achieved.

In the laser light source device, the relationship between the height of the optical element and the height of the optical combiner or reflecting member is optimized, and the optical combiner can be mounted in the optimum position by considering the spreading of the light path of the laser light emitted from the optical element. The laser light source device thus achieves low optical loss and a high coupling efficiency with an external optical circuit or a light modulator (not shown). Furthermore, since some of the thickness of the optical combiner is accommodated within the silicon substrate by forming the step on the silicon substrate, the laser light source device can be made extremely thin.

In the laser light source device, the light path length can be made equal for all the laser light emitted from the plurality of optical elements. As a result, since the light path diameter can be made equal for all of the laser light without having to insert a lens in the light path, the laser light source device does not require the provision of a lens.

In the laser light source device, when the optical element is a laser device, the light source is compact in size, has long service life, and achieves high brightness. Further, in the laser light source device, when the optical combiner is a dichroic mirror prism, the bottom face of the prism is substantially triangular in shape; therefore, by forming an Au film on the bottom face, the prism can be reliability bonded to the silicon substrate.

In the laser light source device, when the driver IC for driving the optical element is mounted on the silicon substrate, the driver IC need not be provided outside the substrate but can be integrated on the substrate, and the laser light source device can be made extremely compact in size.

In the laser light source device manufacturing method, since the optical elements and optical combiners are bonded to the silicon substrate by surface activated bonding, component misalignment is minimized, and highly accurate alignment can be achieved.

In the laser light source device manufacturing method, when the number of optical elements mounted is three, the light path of the light to be emitted outside can be adjusted by just adjusting the positions of two optical combiners, and thus the light path adjustment can be accomplished extremely easily.

In the laser light source device manufacturing method, when the optical element is a laser device, and the optical combiner is a dichroic mirror prism, component misalignment is minimized, and highly accurate alignment can be achieved.

In the laser light source device manufacturing method, when the step of mounting a driver IC for driving the optical elements is included, the step of providing the driver IC outside the substrate can be eliminated, and the manufacturing process can thus be simplified.

BRIEF DESCRIPTION OF THE DRAWINGS

FIG. 7(a) is a perspective view for explaining an optical element bonding step, and FIG. 7(b) is a perspective view for explaining the bonding of a first optical combiner.

FIG. 8(a) is a perspective view for explaining the bonding of a second optical combiner, and FIG. 8(b) is a perspective view for explaining the bonding of a third optical combiner.

DESCRIPTION

A laser light source device and a method for manufacturing the laser light source device will be described below with reference to the drawings. It will, however, be noted that the technical scope of the present invention is not limited by any particular embodiment described herein, but extends to the inventions described in the appended claims and their equivalents.

Figure 1:
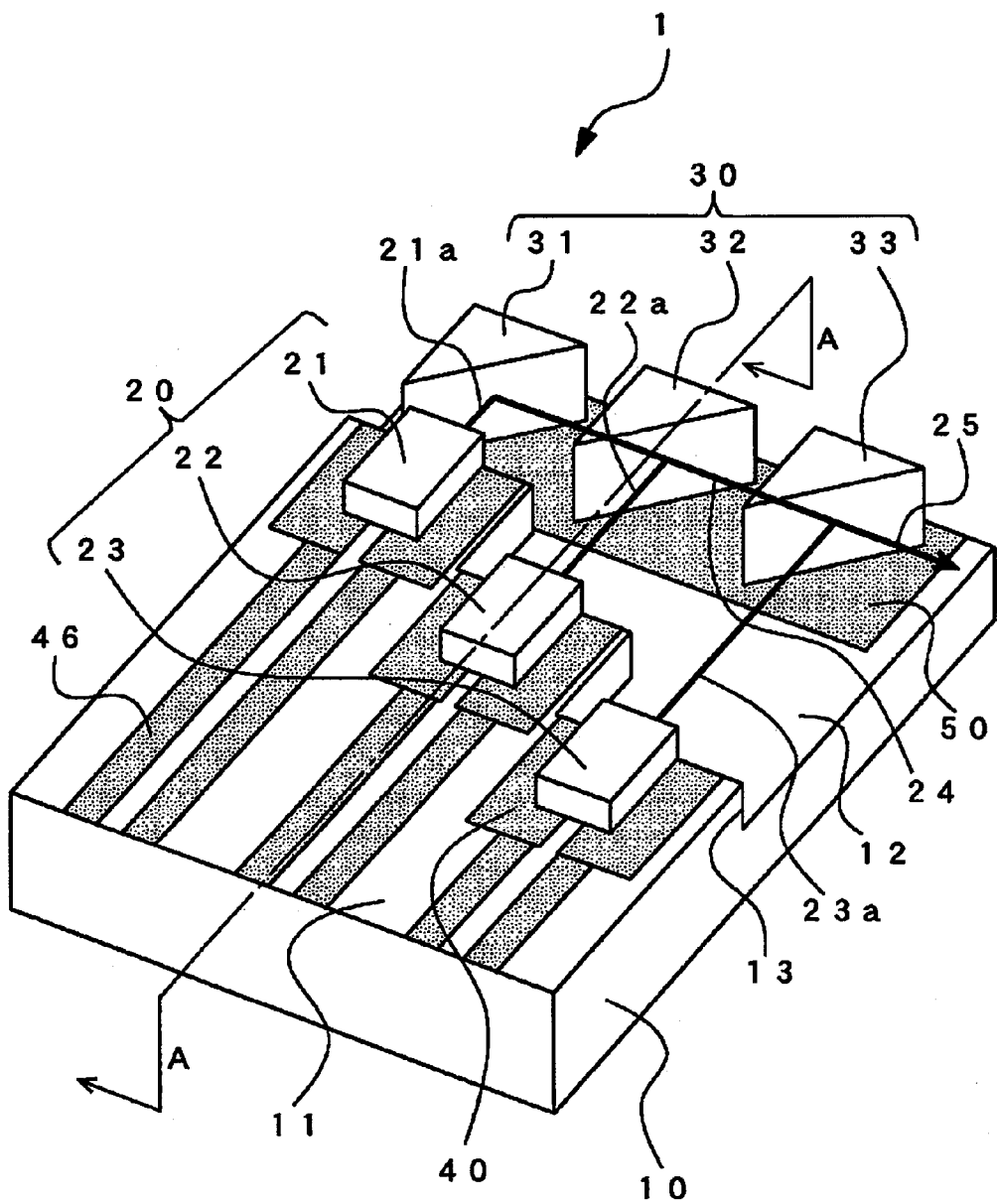
FIG. 1 is a diagram showing in schematic form the configuration of a laser light source device 1.

FIG. 1 is a diagram showing in schematic form the configuration of a laser light source device 1.

The laser light source device 1 will be described below with reference to FIG. 1. The basic structure of the laser light source device 1 is characterized in that a plurality of laser devices (21, 22, 23) and dichroic mirror prisms (31, 32, 33) are bonded to a stepped substrate 10 by surface activated bonding.

The laser light source device 1 comprises the silicon substrate 10 as a platform, and the laser devices 21, 22, and 23 as a plurality of optical elements and the dichroic mirror prisms 31, 32, and 33 (hereinafter referred to as the dichroic prisms 31, 32, and 33) as a plurality of optical combiners mounted on the silicon substrate 10. In the description hereinafter given, the term laser device 20 will be used when referring to the plurality of laser devices collectively, and the term dichroic prism 30 will be used when referring to the plurality of dichroic prisms collectively.

The silicon substrate 10 has a first planar surface 11 and a second planar surface 12, the second planar surface 12 being formed lower than the first planar surface 11 by forming therebetween a step 13 in the thickness direction of the silicon substrate. The step 13 is formed in a staircase shape horizontally across the first planar surface 11, and the laser devices 20 are bonded to the first planar surface 11 so as to be arranged along the edge faces of the staircase-shaped step 13.

The dichroic prisms 30 are bonded to the second planar surface 12 at positions corresponding to the respective laser devices 20. That is, the dichroic prism 31 is bonded at a position to which the laser light emitted from the laser device 21 is directed, the dichroic prism 32 is bonded at a position to which the laser light emitted from the laser device 22 is directed, and the dichroic prism 33 is bonded at a position to which the laser light emitted from the laser device 23 is directed.

A bonding portion 40 having a micro-bump structure made of Au (gold) for bonding the laser device 20 thereon is formed on the first planar surface 11 of the silicon substrate 10. The bonding portion 40 is electrically connected to the bottom electrode (not shown) of the laser device 20, and is electrically connected to an external laser device driving circuit (not shown) via a plurality of electrode patterns 46 formed on the first planar surface 11.

A bonding portion 50 having a micro-bump structure made of Au (gold) for bonding the dichroic prism 30 thereon is formed on the second planar surface 12. The details of the bonding portions 40 and 50 will be described later. The laser device 20 may be a laser device that directly emits laser light of a designated color, or may be a second harmonic generation (SHG) laser device or the like. In the case of the SHG laser device, there is a need to add a wavelength conversion device that receives laser light from the laser device 20 and converts it into light at the second harmonic wavelength.

The operation of the laser light source device 1 will be briefly described below. When a drive current is supplied from the external laser device driving circuit via the electrode patterns 46 and the bonding portion 40, the laser device 20 emits laser light of a designated color. For example, the laser device 21 is a red laser device and emits red laser light 21a (hereinafter simply the R laser light 21a), the laser device 22 is a green laser device and emits green laser light 22a (hereinafter simply the G laser light 22a), and the laser device 23 is a blue laser device and emits blue laser light 23a (hereinafter simply the B laser light 23a).

The R laser light 21a emitted from the laser device 21 enters the corresponding dichroic prism 31; the dichroic prism 31 is a reflecting member and reflects the R laser light 21a toward its adjacent dichroic prism 32. The dichroic prism 32 selectively transmits the entering R laser light 21a, and selectively reflects the G laser light 22a incident from the laser device 22. In this way, the dichroic prism 32 combines the R laser light 21a with the G laser light 22a, and directs the combined RG laser light 24 to its adjacent dichroic prism 33.

The dichroic prism 33 selectively transmits the entering RG laser light 24, and selectively reflects the B laser light 23a incident from the laser device 23. In this way, the dichroic prism 33 combines the RG laser light 24 with the B laser light 23a, and outputs the RGB laser light 25. That is, the RGB laser light 25 is produced by combining the R laser light 21a, the G laser light 22a, and the B laser light 23a. A high-quality full color image can be displayed by converting the RGB laser light 25 into image light using an external spatial light modulating means (not shown) and by projecting the light onto a screen (not shown) through a projection optic means (not shown).

Figure 2:
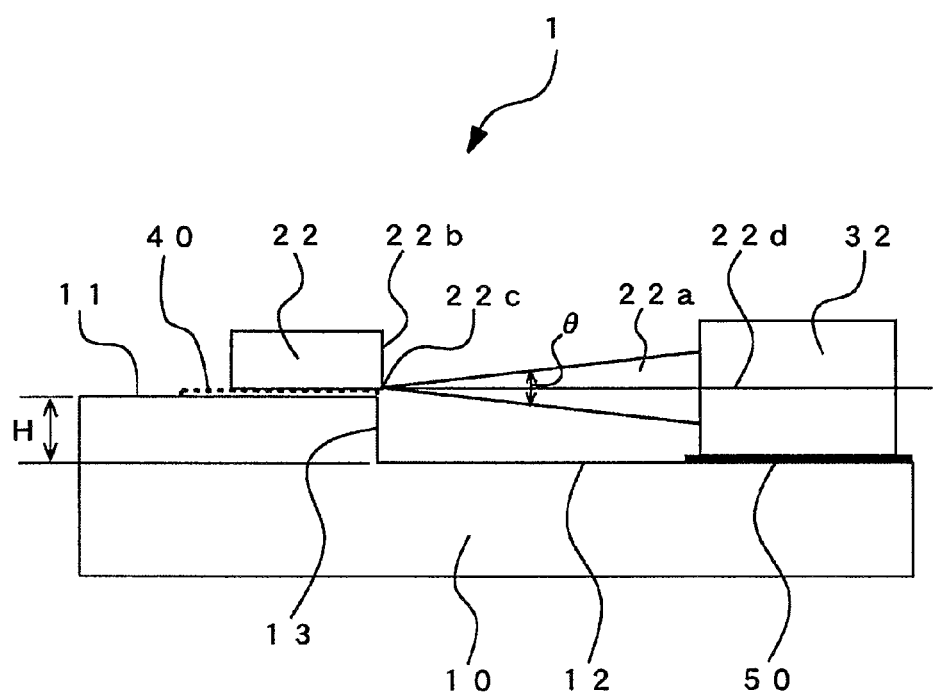
FIG. 2 is a cross-sectional view taken along line AA' in FIG. 1.

FIG. 2 is a cross-sectional view taken along line AA' in FIG. 1.

The relationship between the height of the laser device and the height of the dichroic prism in the laser light source device 1 will be described below with reference to FIG. 2. As shown in FIG. 2, the laser device 22 is bonded via the bonding portion 40 to the silicon substrate 10 along an edge face of the step 13 formed across the first planar surface 11 of the silicon substrate 10. Preferably, the laser device 22 is bonded so that its light-emitting face 22b slightly protrudes from the edge face of the step 13.

The G laser light 22a can then be emitted from the light-emitting face 22b without being vignetted by the first planar surface 11. The light-emitting face 22b has a light-emitting port 22c at its lower end, from which the G laser light 22a is emitted. As shown, the G laser light 22a emitted from the light-emitting port 22c gradually spreads out at a prescribed angle θ as it travels forward.

The dichroic prism 32 for the laser device 22 is bonded via the bonding portion 50 to the silicon substrate 10 at the second planar surface 12 thereof which is formed lower than the first planar surface 11 by the height of the step 13. Thus, the dichroic prism 32 is located at a prescribed position lower than the laser device 22.

The height H of the step 13 is determined so that the optical axis 22d defining the center of the light path of the G laser light 22a passes through the position located approximately halfway through the thickness of the dichroic prism 32. With this arrangement, if the light path of the G laser light 22a enters the dichroic prism 32 while spreading out at the angle θ as shown, the dichroic prism 32 can accommodate the entire light path of the spreading out G laser light 22a and can reflect the light in its entirety for output.

The silicon substrate 10 has the first planar surface 11 and the second planar surface 12, the second planar surface 12 being formed lower than the first planar surface 11 by the height H of the step 13 formed in the thickness direction, and the laser device 20 is bonded to the first planar surface 11 while the dichroic prism 30 is bonded to the second planar surface 12. With this structure, the relationship between the height of the laser device 20 and the height of the dichroic prism 30 is optimized so that the dichroic prism 30 can accommodate the spread out light path of the laser light without any loss. The laser light source device 1 thus achieves low optical loss and a high coupling efficiency with an external optical circuit or a light modulator (not shown).

The dichroic prism 30 must have a sufficient thickness to accommodate the laser light. Since the dichroic prism 30 is bonded to the lower second planar surface 12 of the silicon substrate 10, some of the thickness of the dichroic prism 30 is accommodated within the silicon substrate 10, which means that the laser light source device 1 can be made extremely thin. While FIG. 2 has shown the relationship between the height of the laser device 22 and the height of the dichroic prism 32, the above description also applies to the relationship between the height of the laser device 21 and the height of the dichroic prism 31 and the relationship between the height of the laser device 23 and the height of the dichroic prism 33.

Figure 3:
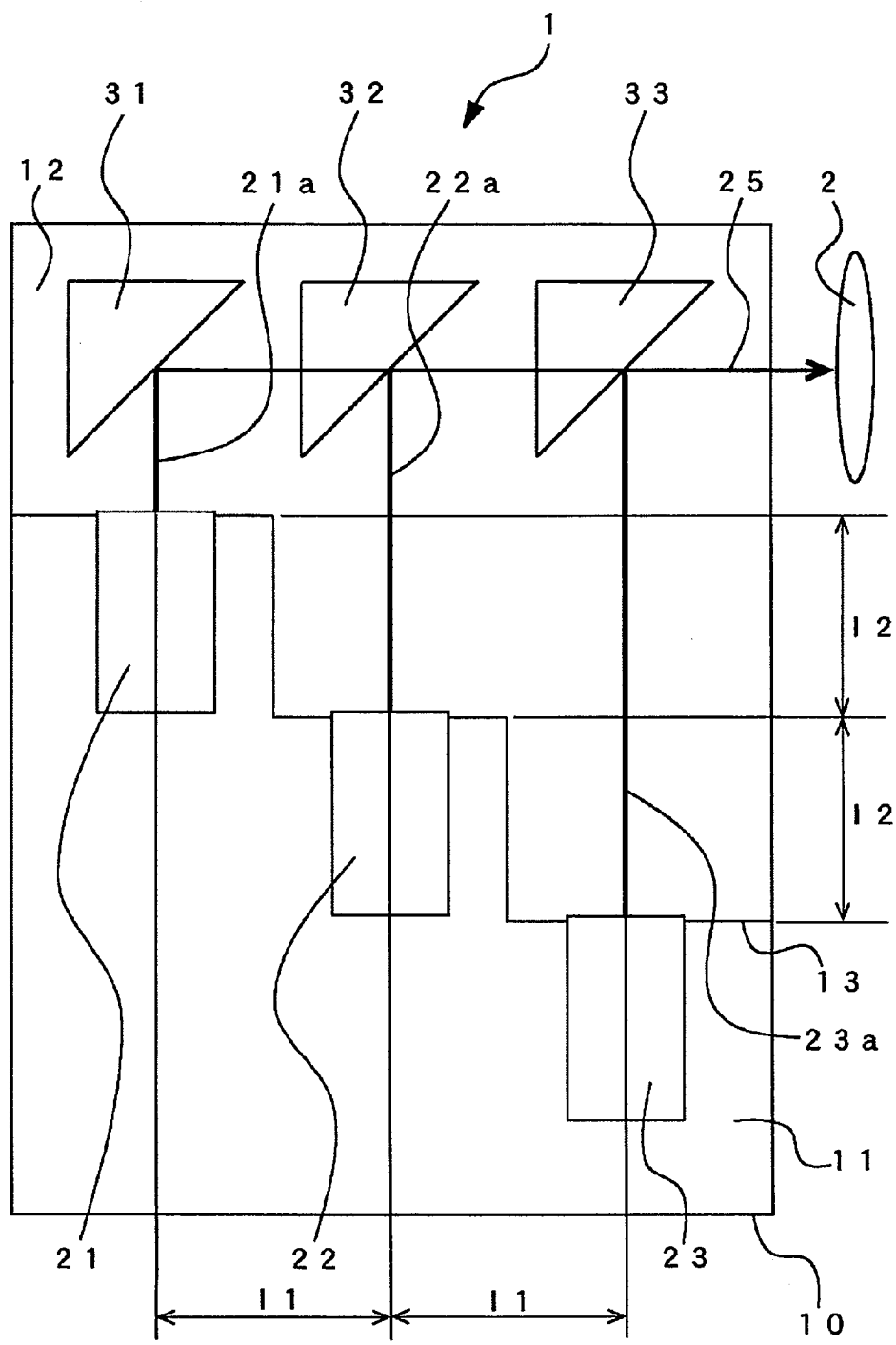
FIG. 3 is a top plan view of the laser light source device 1.

FIG. 3 is a top plan view of the laser light source device 1.

The light path length of the laser light in the laser light source device 1 will be described below with reference to FIG. 3. In FIG. 3, the bonding portions 40 and 50 and the electrode patterns 46 are omitted from illustration. In FIG. 3, the step 13 of the silicon substrate 10 is formed in a staircase shape horizontally across the first planar surface 11, as previously described, and the laser devices 20 are bonded to the first planar surface 11 so as to be arranged along the edge faces of the staircase-shaped step 13.

The R laser light 21a emitted from the laser device 21 enters the dichroic prism 31, is reflected at right angles by the dichroic prism 31 and transmitted through the dichroic prisms 32 and 33, and enters an external lens 2. On the other hand, the G laser light 22a emitted from the laser device 22 enters the dichroic prism 32, is reflected at right angles by the dichroic prism 32 and transmitted through the dichroic prism 33, and enters the external lens 2. Further, the B laser light 23a emitted from the laser device 23 enters the dichroic prism 33, is reflected at right angles by the dichroic prism 33, and enters the external lens 2.

The external lens 2 is an optical component for transmitting the combined RGB laser light 25 to an external spatial light modulating means (not shown). Each laser light spreads out while traveling along the light path, but the light path here is shown as being a straight line for ease of understanding.

As shown, the light paths for the R laser light 21a, G laser light 22a, and B laser light 23a emitted from the respective laser devices 20 are spaced apart from each other in a horizontal direction by a distance l1. The shorter the distance l1, the smaller the size of the silicon substrate 10 can be made, but a distance of a certain length must be provided because of constrains such as the patterns of the bonding portions 40 (see FIG. 1) and the tool (not shown) used for bonding the laser devices 20 by surface activation. Because of the presence of this distance l1, if all the laser devices 20 were arranged horizontally in a row, the light path length from the dichroic prism 30 to the lens 2 would be different for each laser light.

If all the laser devices 20 were arranged horizontally in a row, the light path length of the R laser light 21a emitted from the laser device 21 located farthest from the lens 2 would be longer by twice the distance 11 than the light path length of the B laser light 23a emitted from the laser device 23 located nearest to the lens 2. If the light path length thus differed, the light path diameter (beam diameter) of the R laser light 21a traveling the longer light path length would become larger than the light path diameter (beam diameter) of the B laser light 23a traveling the shorter light path length, because the laser light spread out at the angle θ as earlier described. As a result, the RGB laser light 25 output from the dichroic prism 33 would reach the lens 2 as a beam produced by combining the laser light of different colors having different light path diameters. Therefore, if the thus combined RGB laser light 25 were modulated, a problem may occur due to such flaws as image color nonuniformity.

To address the above problem, in the laser light source device 1, the step 13 is formed in a staircase shape between the first and second planar surfaces 11 and 12 horizontally across the width thereof, and the laser devices 20 are bonded to the first planar surface 11 so as to be arranged along the edge faces of the step 13. Then, the per-step distance 12, the distance from one step to the next, of the staircase-shaped step 13 is made equal to the distance 11 between the light paths. Thus, in the laser light source device 1, the difference in light path length due to the distance 11 is accommodated by the per-step distance 12 so that the light path length becomes equal for all of the laser light.

The laser device 21 located farthest from the lens 2 is bonded at the position corresponding to the top of the staircase-shaped step, that is, at the position nearest to the dichroic prism 31 and not spaced by the distance 12. The laser device 22 located at an intermediate position from the lens 2 is bonded at the position corresponding to the first stepped portion of the staircase-shaped step, that is, at the position spaced farther away from the dichroic prism 32 by the distance 12. The laser device 23 located nearest to the lens 2 is bonded at the position corresponding to the second stepped portion of the staircase-shaped step, that is, at the position spaced farther away from the dichroic prism 33 by twice the distance 12.

In this way, by forming the step 13 in a staircase shape horizontally across the surface, and by bonding the laser devices 20 along the edge faces of the step 13, the distance between each laser device 20 and the dichroic prism 30 corresponding to the laser device 20 is made different so that the light path length becomes equal for all the laser light. As a result, since the light path diameter can be made equal for all the colors of the RGB laser light 25 entering the lens 25, a high-quality image free from flaws such as color nonuniformity can be obtained.

If a lens is inserted in the light path between the laser device 20 and the dichroic prism 30, and control is performed so that the laser light does not spread out, the light path diameter can be prevented from varying even if the light path length differs for each laser light. However, arranging such lenses on the silicon substrate 10 involves additional steps for mounting and adjusting the lenses, and can lead to the problem that the size of the silicon substrate 10 increases because of the space for mounting the lenses. In view of this, in the laser light source device 1, the light path length of each laser light is made equal, eliminating the need for mounting such lenses on the silicon substrate 10, and thus offering an enormous effect in simplifying the manufacturing process and reducing the size and thickness of the light source unit.

Figure 4:
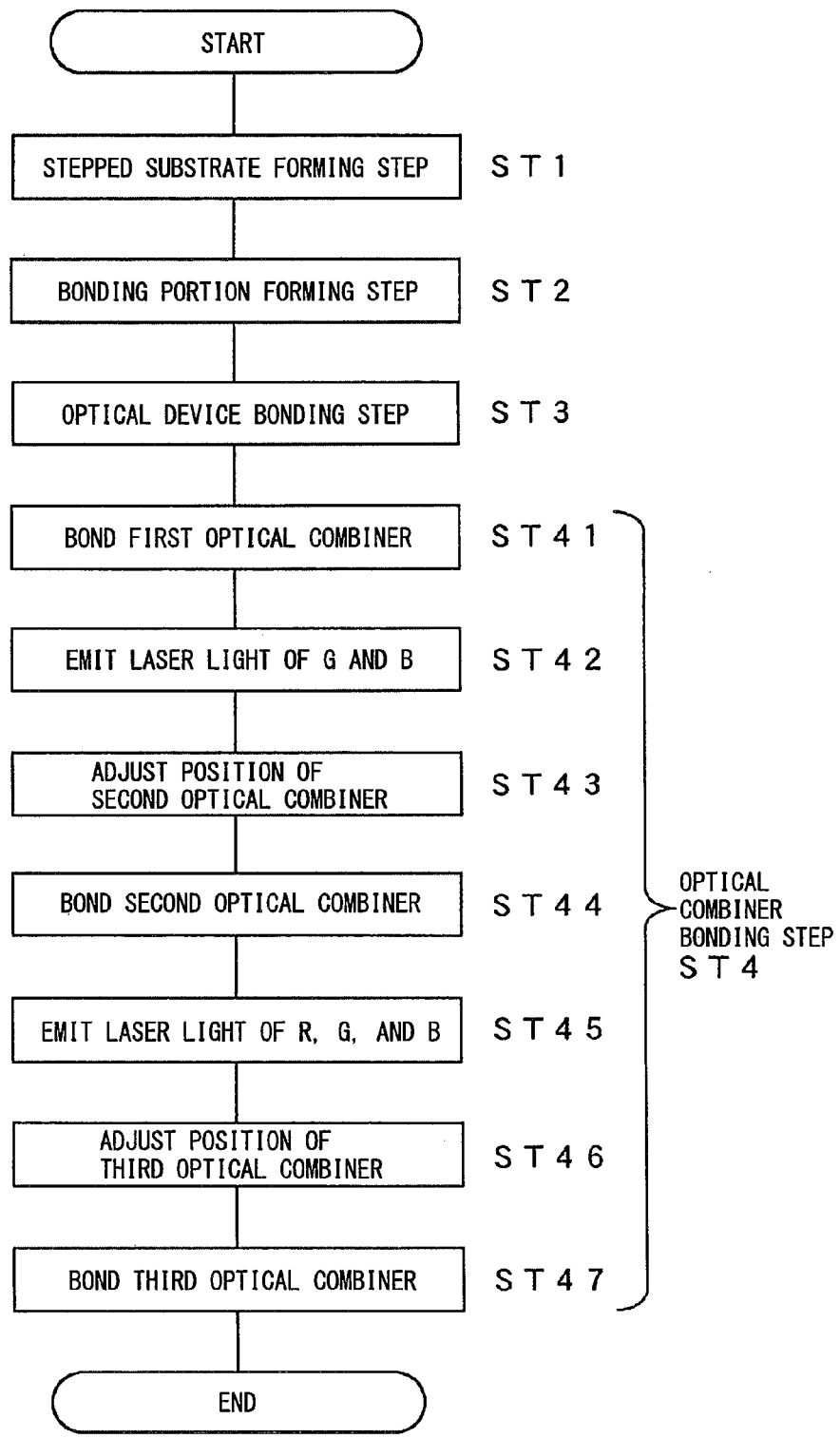
FIG. 4 is a process diagram illustrating the manufacturing steps of the laser light source device 1.

FIG. 4 is a process diagram illustrating the manufacturing steps of the laser light source device 1.

First, the first and second planar surfaces 11 and 12 such as shown in FIG. 1 are formed by forming the step 13 by deep etching the surface of the silicon substrate 10 manufactured in accordance with an LSI manufacturing process (Step ST1: Stepped substrate forming step). The height H of the step to be formed is determined by the relationship between the height of the laser device and the height of the dichroic prism, as earlier described, and is about 100 to 500 μm.

Next, the bonding portions 40 and 50, each having a micro-bump structure, are formed on the first and second planar surfaces 11 and 12, respectively, of the silicon substrate 10 (Step ST2: Bonding portion forming step).

Figure 5:
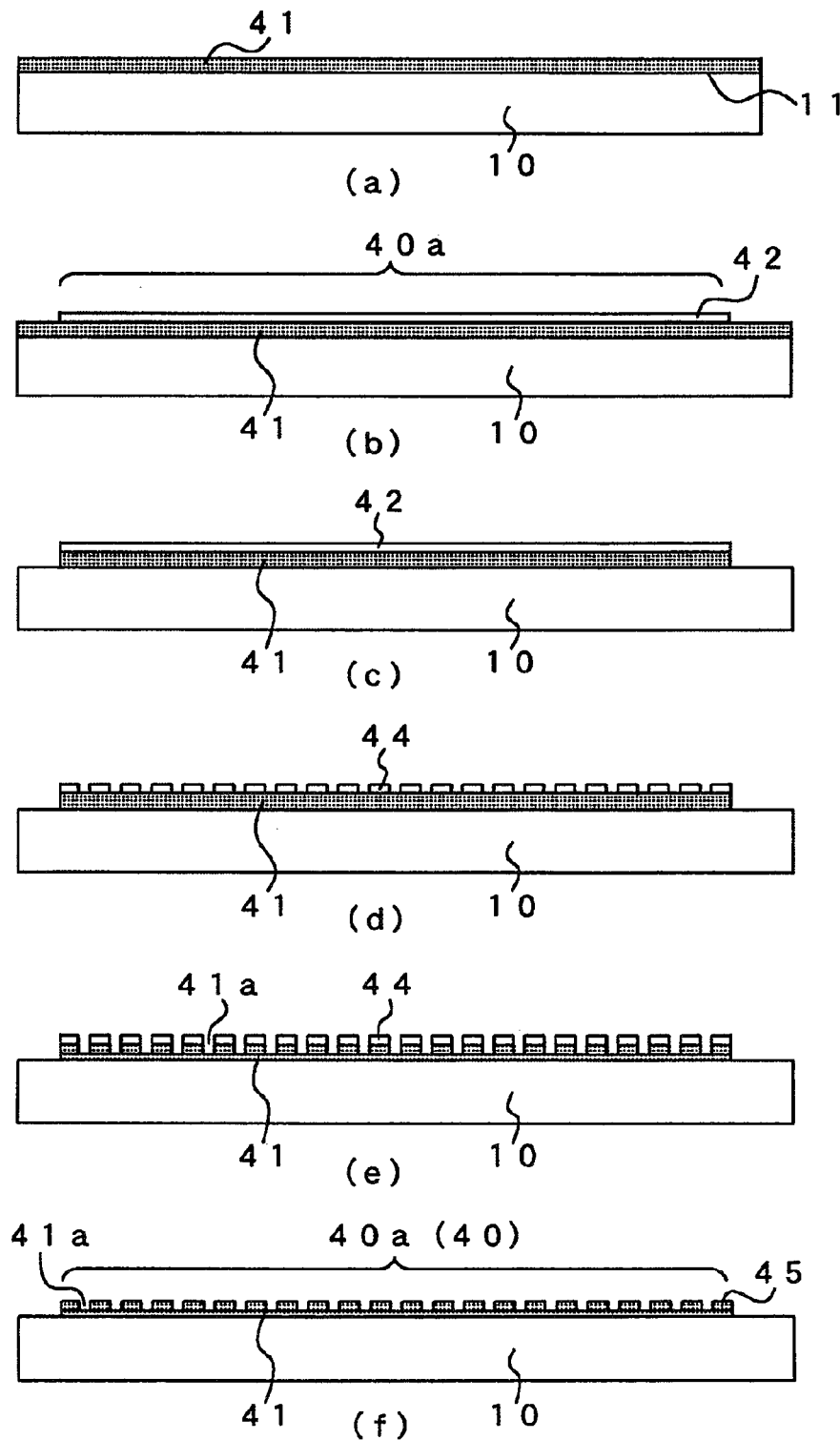
FIG. 5 is a process diagram illustrating the details of a bonding portion forming step.

FIG. 5 is a process diagram illustrating the details of the bonding portion forming step. FIGS. 5(a) and 5(f) are enlarged cross-sectional views showing a portion of the first planar surface 11 of the silicon substrate 10 of FIG. 1 cut across the thickness thereof.

First, an Au film 41 of gold as a metal material is formed on the first planar surface 11 of the silicon substrate 10 (see FIG. 5(a)).

Next, a resist film 42 is formed in order to leave the Au film 41 as an electrode in a region 40a where the bonding portion 40 is to be formed (see FIG. 5(b)). That is, the region 40a is eventually formed as the bonding portion 40.

Next, the electrode is formed by etching away the Au film 41 everywhere except the portion thereof covered by the resist film 42 (see FIG. 5(c)). In this way, the Au film 41 is formed as the electrode in the region 40a.

Then, after removing the resist film 42, a resist film 44 for micro-bump formation is formed on the surface of the Au film 41 left as the electrode (see FIG. 5(d)). The resist film 44 is formed, for example, in a pattern in which a larger number of tiny dots substantially circular in shape are arranged when viewed from the top.

Next, half etching is performed to form a groove 41a to a prescribed depth in the Au film 41 exposed through each interstice of the dot-like pattern of the resist film 44 (see FIG. 5(e)).

Thereafter, the resist film 44 is removed, and the region 40a containing a large number of micro bumps 45 is formed as the bonding portion 40 (see FIG. 5(f)). In this way, the large number of micro bumps 45 arranged in a dot-like pattern defined by the grooves 41a are formed on the surface of the Au film 41 left in the region 40a. Since the Au film 41 in the spacing between each micro bump 45, that is, in the bottom of each groove 41a, is left unremoved so that the lower parts of the micro bumps 45 are connected to each other by the Au film 41, the entire region 40a can be made to conduct and act as an electrode. The process so far described also applies to the formation of the bonding portion 50 to be formed on the second planar surface 12.

When forming other electrode patterns 46, etc. (see FIG. 1) than the micro bumps on the surface of the silicon substrate 10, the resist film 42 formed in the step of FIG. 5(b) is patterned to match the electrode patterns 46. Then, by etching the resist film 42 patterned to match the electrode patterns 46 (see FIG. 5(c)), the electrode patterns 46, etc. can be formed. According to the bonding portion forming step described above, the bonding portions 40 and 50, each having a micro-bump structure formed from an Au film, and the electrode patterns 46, etc. can be formed efficiently in a collective manner on the surface of the silicon substrate 10.

Figure 6:
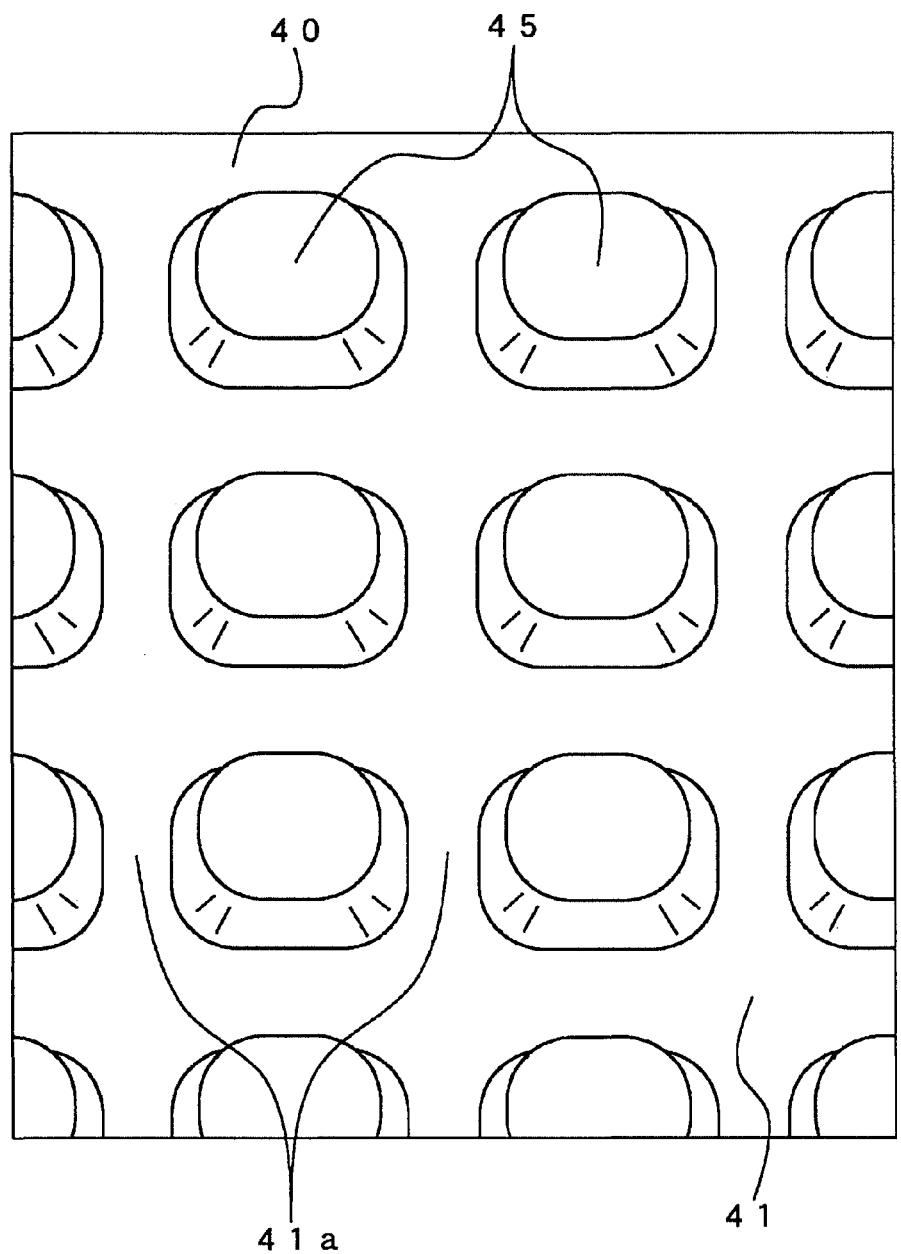
FIG. 6 is a perspective view showing in enlarged form a portion of a bonding portion 40 formed in the bonding portion forming step (ST2).

FIG. 6 is a perspective view showing in enlarged form a portion of the bonding portion 40 formed in the bonding portion forming step (ST2).

As shown in FIG. 6, the micro bumps 45 formed from Au are substantially cylindrical in shape; as an example, each micro bump 45 is formed with a diameter of about 8 μm and a height of about 2 μm. Since the Au film 41 is left in the spacing between each micro bump 45, that is, in the bottom of each groove 41a, as described above, the micro bumps 45 are mechanically and electrically connected together by the Au film 41, and the structure is thus formed as an integral one-piece electrode.

An outline of the surface activated bonding technique used in the optical element bonding step and optical combiner bonding step performed on the bonding portions 40 and 50 of the micro-bump structure will be described below.

The surface activated bonding technique is a technique that activates material surfaces by removing inactive layers, such as oxides, dirt (contaminants), etc. covering the material surfaces by plasma or other means, and that bonds the surfaces together by causing atoms having high surface energy to contact each other and by utilizing the adhesion forces acting between the atoms. However, in the case of flat bonding surfaces, surface activated bonding cannot be accomplished unless the surfaces are heated to a certain temperature (100 to 150° C.). In the laser light source device 1, in order to lower the bonding temperature, the micro bumps 45 are formed from Au, a material that easily deforms plastically, on one side of the bonding surface, that is, on the bonding portions 40 and 50 of the silicon substrate 10 so that the bonding can be accomplished at normal temperatures.

The principle of the surface activated bonding technique will be described. Films of oxides, contaminants, etc. remain adhered to the actual surface (including the bonding portions 40 and 50). Therefore, plasma cleaning or ion-beam sputter etching is performed, and the surfaces of the bonding portions 40 and 50 are activated, thus putting the surfaces of the bonding portions 40 and 50 in an activated condition in which the atoms having bonds are exposed on the surfaces. In this condition, interatomic bonding can be accomplished by just bringing the lower surfaces of the laser device 20 and the dichroic prism 30 into contact with the respective bonding portions 40 and 50.

Since this surface activated bonding does not require heating when bonding, there are the following advantages.

1. Component breakage due to the residual stress arising from the difference in thermal expansion coefficient does not occur.

2. Since no thermal stress is applied to the components, functional degradation of the components does not occur.

3. Since the bonding is done in a solid phase without heating, misalignment does not occur during component mounting.

4. No thermal effects are caused to other components.

5. Since the atoms are directly bonded together, the bonded layers do not deteriorate over time.

Next, each laser device 20 as an optical element is bonded to the bonding portion 40 on the first planar surface 11 of the silicon substrate 10 (step ST3: Optical element bonding step). The optical element bonding step will be described with reference to FIG. 7(a).

As shown, the bonding portion 40 is formed on the first planar surface 11 of the silicon substrate 10, and the large number of micro bumps are formed on the bonding portion 40 in accordance with the earlier described bonding portion forming step. Each laser device 20 is bonded to the bonding portion 40 by using the above-described surface activated bonding technique. Preparatory to the bonding, the bonding portion 40 of the silicon substrate 10 and the lower surface of the laser device 20 are cleaned by argon plasma, and the respective surfaces are activated. An Au film (not shown) is formed as the electrode on the bonding surface on the underside of the laser device 20.

For example, when bonding the laser device 23, the laser device 23 is held onto a pressing tool 3, and is placed in a prescribed position on the bonding portion 40 of the silicon substrate 10. At this time, the laser device 23 must be accurately positioned so that it can be bonded to the prescribed position at the edge face of the step 13. The positioning of the laser device 23 can be accomplished, for example, by aligning it with an alignment marker (not shown) attached to the prescribed position on the bonding portion 40.

Once the laser device 23 is aligned and placed in the prescribed position, a prescribed load is applied to the laser device 23 by the pressing tool 3. This causes the Au film on the underside of the laser device 23 to contact the micro bumps 45 (see FIG. 6) formed on the bonding portion 40, and the micro bumps 45 are slightly deformed in the thickness direction under pressure. Since the Au forming the micro bumps 45 and the Au film on the underside of the laser device 23 are both activated, the silicon substrate 10 and the laser device 23 are bonded together at normal temperature (surface activated bonding). The laser devices 21 and 22 are also bonded in the same manner.

Next, each dichroic prism 30 as an optical combiner is bonded to the bonding portion 50 on the second planar surface 12 of the silicon substrate 10 (step ST4: Optical combiner bonding step). The optical combiner bonding step ST4 comprises sub-steps ST41 to ST47. The optical combiner bonding step ST4 will be described with reference to FIG. 8 in conjunction with FIG. 7(b).

As shown in FIG. 7(b), the dichroic prism 33 as the first optical combiner is held onto the pressing tool 3, and is placed in a prescribed position on the bonding portion 50 formed on the second planar surface 12 of the silicon substrate 10. The dichroic prism 33 is mounted in the position corresponding to the laser device 23 so that the B laser light 23a (see FIG. 1) from the laser device 23 can be reflected. Since the dichroic prism 33 must also be accurately positioned, it is preferable to position it in reference, for example, to an alignment marker (not shown) attached to the prescribed position on the bonding portion 50.

Next, by applying a prescribed load K to the dichroic prism 33 using the pressing tool 3, the dichroic prism 33 is bonded by surface activated bonding in the same manner as the laser device (ST41). An Au film is formed on the bottom face of the dichroic prism 30. A dichroic mirror which is functionally equivalent to the dichroic prism 30 may be used, but since such a mirror is thin, it is difficult to bond it to the silicon substrate 10. By contrast, the bottom face of the dichroic prism 30 is a triangular face; therefore, by forming an Au film on the bottom face, the dichroic prism 30 can be reliability bonded to the silicon substrate 10.

Next, external drive current is applied to the laser devices 22 and 23 to cause them to emit the G laser light 22a and the B laser light 23a, respectively (ST42).

Then, as shown in FIG. 8(a), while causing the laser devices to emit the G laser light 22a and the B laser light 23a, respectively, the dichroic prism 32 as the second optical combiner is held onto the pressing tool 3, and is placed in a prescribed position on the bonding portion 50 formed on the second planar surface 12 of the silicon substrate 10. Then, the GB laser light 26 output from the dichroic prism 33 (that is, the light produced by combining the G laser light 22a and the B laser light 23a) is detected by an external detector 4. Here, the position of the dichroic prism 32 is determined by adjusting the position in the X- and Y-axis directions as well as the angle thereof using the pressing tool 3 so that the light path of the G laser light 22a and the light path of the B laser light 23a overlap each other within the prescribed position (ST43).

After positioning the dichroic prism 32, a prescribed load K is applied to the dichroic prism 32 using the pressing tool 3 to accomplish the surface activated bonding (ST44).

Next, external drive current is applied to all the laser devices 20 to cause them to emit the R laser light 21a, the G laser light 22a and the B laser light 23a, respectively (ST45).

Then, as shown in FIG. 8(b), while causing the laser devices to emit the R laser light 21a, the G laser light 22a and the B laser light 23a, respectively, the dichroic prism 31 as the third optical combiner is held onto the pressing tool 3, and is placed in a prescribed position on the bonding portion 50 formed on the second planar surface 12 of the silicon substrate 10. Then, the RGB laser light 25 output after mounting the dichroic prism 31 (that is, the light produced by combining the R laser light 21a, the G laser light 22a and the B laser light 23a) is detected by the detector 4. Here, the position of the dichroic prism 31 is determined by adjusting the position in the X- and Y-axis directions as well as the angle thereof using the pressing tool 3 so that the light path of the R laser light 21a, the light path of the G laser light 22a, and the light path of the B laser light 23a overlap each other within the prescribed position (ST46).

After positioning the dichroic prism 31, a prescribed load K is applied to the dichroic prism 31 using the pressing tool 3 to accomplish the surface activated bonding (ST47). By performing the sub-steps ST41 to ST47 as described above, the optical combiner bonding step is completed, completing the manufacture of the laser light source device in which the light path of the RGB laser light 25 to be emitted outside has been accurately adjusted.

Since the laser devices and dichroic prisms are bonded by surface activated bonding and integrated on the silicon substrate, as described above, the laser light source device 1 is highly space efficient and is extremely thin and compact in size. Furthermore, since each laser device is directly bonded to the silicon substrate via Au having good thermal conductivity, the laser light source device 1 has excellent heat dissipation characteristics and is advantageous for a pico projector to be mounted in a portable device.

Further, the laser devices and dichroic prisms are bonded to the substrate via micro bumps by using the surface activated bonding technique that does not require heating for bonding. Accordingly, in the laser light source device 1, any distortion that may occur due to the difference in thermal expansion coefficient between the substrate and the laser device is suppressed and, since no thermal stress is applied, functional degradation of the components does not occur. Furthermore, since misalignment during component mounting is minimized, the laser light source device 1 can produce the highly accurately combined RGB laser light and can be used to achieve a high-performance projector free from flaws such as color nonuniformity.

Moreover, in the laser light source device 1, the light path adjustment is extremely easy because the light path of the RGB laser light to be emitted outside can be adjusted by just adjusting the positions of two dichroic prisms.

Figure 9:
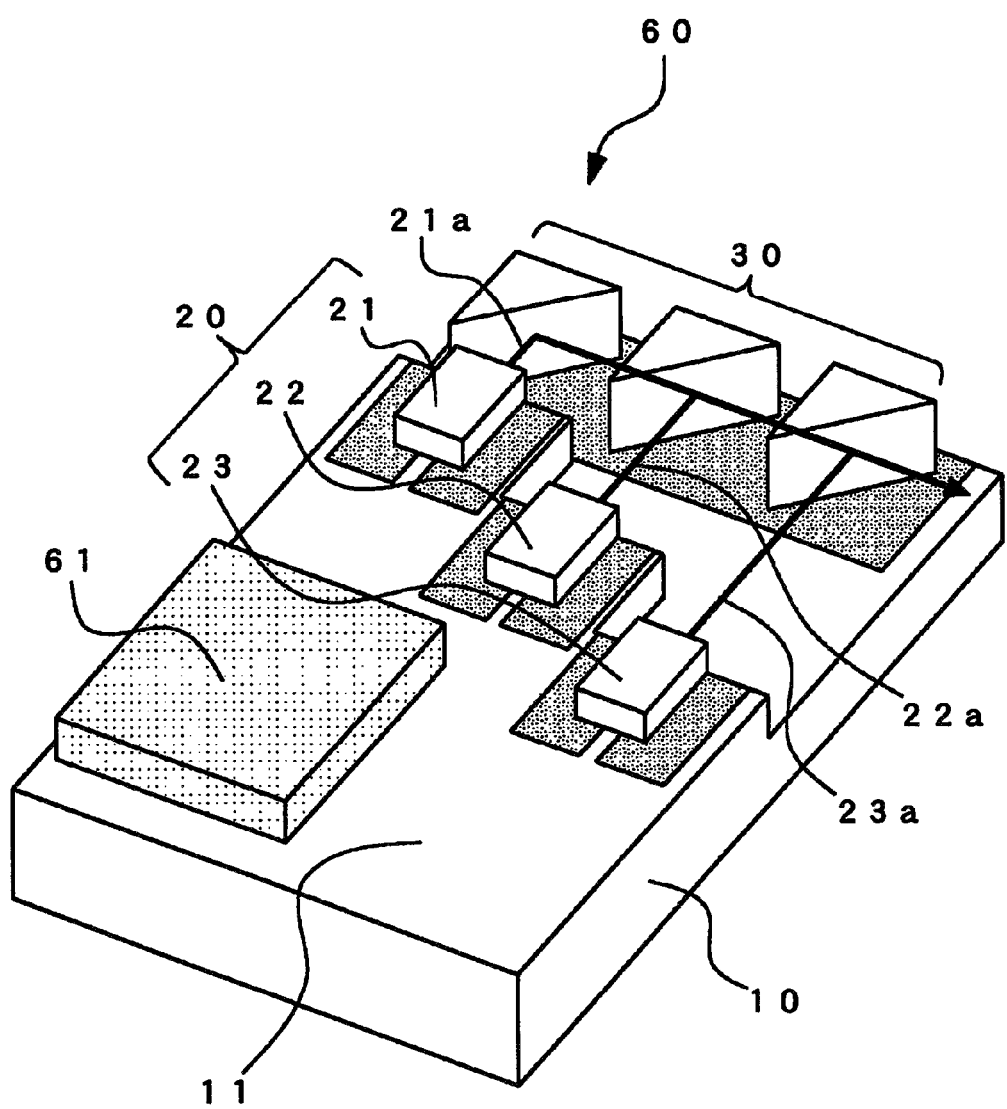
FIG. 9 is a diagram showing in schematic form the configuration of an alternative laser light source device 60.

FIG. 9 is a diagram showing in schematic form the configuration of an alternative laser light source device 60.

The laser light source device 60 will be described below with reference to FIG. 9. In the laser light source device 60, the same component elements as those in the laser light source device 1 are designated by the same reference numerals, and the description of such component elements will not be repeated here. The basic structure of the laser light source device 60 differs from that of the laser light source device 1 in that an IC chip for driving the laser devices is mounted and integrated on the silicon substrate.

The laser light source device 60 comprises the silicon substrate 10, the laser devices 21, 22, and 23 as a plurality of optical elements and the dichroic prisms 31, 32, and 33 as a plurality of optical combiners mounted on the silicon substrate 10, and the driver IC 61. The laser devices 21, 22, and 23 and the dichroic prisms 31, 32, and 33 are identical in structure and operation to the corresponding components in the laser light source device 1, and will not be further described herein.

The driver IC 61 is bonded to the first planar surface 11 by surface activated bonding, is supplied with power from an external source, and drives the plurality of laser devices 20 to cause them to emit the R laser light 21a, the G laser light 22a, and the B laser light 23a, respectively. The driver IC 61 is connected to the respective laser devices 20 by interconnection patterns formed on the first planar surface 11, but the interconnection patterns are not shown in FIG. 9.

The step of bonding the driver IC 61 to the silicon substrate 10 can be performed simultaneously with the bonding of the laser devices 20 in the optical element bonding step (step ST3) in the manufacturing process of the laser light source device 1, and therefore will not be described herein.

Since the driver IC 61 for driving the laser devices 20 is mounted on the silicon substrate 10 as described above, the driver IC 61 need not be provided outside the substrate but can be integrated on the substrate, and the laser light source device 60 can be made extremely compact in size. Furthermore, in the laser light source device 60, since the number of interconnection lines to be wired to the laser light source device can be reduced by building the driver IC 61 into the laser light source device, not only can the electrical connecting means for the laser light source device be simplified, but the laser light source device can be easily installed.

The configuration, manufacturing process, etc. to be employed for the laser light source devices 1 and 60 are not limited to those shown in the drawings given herein, but may be altered or modified as desired without departing from the spirit and scope of the present invention. Further, while the laser light source devices 1 and 60 have each been described by dealing with an example in which three RGB laser devices are mounted, it will be appreciated that the number of laser devices to be mounted may be two or, alternatively, four or more laser devices may be mounted.

Since the laser light source devices 1 and 60 described above can be made extremely compact and thin in design, these laser light source devices can be used widely as light source units for pico projectors to be mounted in portable devices such as mobile phones.

What is claimed is:

1. A method for manufacturing a laser light source device, comprising the steps of:

forming a first planar surface and a second planar surface on a silicon substrate, said second planar surface being formed lower than said first planar surface by forming therebetween a step in a thickness direction of said silicon substrate;

forming a first bonding portion having a micro-bump structure made of Au on said first planar surface;

forming a second bonding portion having a micro-bump structure made of Au on said second planar surface;

bonding first and second optical elements to said first bonding portion by surface activated bonding, said first and second optical elements being arranged to emit laser light;

bonding an optical combiner to said second bonding portion by surface activated bonding, said optical combiner being positioned to directly receive the laser light from said second optical element and to combine the laser light from said second optical element with the laser light from said first optical element; and adjusting the position of a reflecting member so that a light path of the laser light from said first optical element and a light path of the laser light from said second optical element overlap each other while emitting the laser light from said first and second optical elements after bonding said first optical element, said second optical element and said optical combiner; and bonding said adjusted reflecting member to said second bonding portion by surface activated bonding, and wherein a distance between said first optical element and said reflecting member is made different from a distance between said second optical element and said optical combiner so that a light path length from said first optical element to said optical combiner becomes equal to a light path length from said second optical element to said optical combiner.

2. The manufacturing method according to claim 1, wherein said laser light source device further comprises a third optical element for emitting laser light and a second optical combiner for combining the laser light from said third optical element with the laser light from said second optical element combined by said optical combiner with the laser light from said first optical element, and wherein in the step of adjusting the position of said reflecting member, the position of said reflecting member is adjusted so that a light path of the laser light from said second optical element combined by said optical combiner with the laser light from said first optical element and a light path of the laser light from said third optical element overlap each other.

3. The manufacturing method according to claim 1, wherein said step formed in the thickness direction of said silicon substrate is formed in a staircase shape horizontally across said first planar surface, and wherein said first and second optical elements are arranged along staircase-shaped edge faces of said step formed in said thickness direction.

4. The manufacturing method according to claim 1, wherein said first and second optical elements are laser devices, and said optical combiner is a dichroic mirror prism.

5. The manufacturing method according to claim 1, further comprising the step of mounting on said silicon substrate a driver IC for driving said first and second optical elements.

* * * * *